US009559299B1

(12) United States Patent
Jo

(10) Patent No.: US 9,559,299 B1
(45) Date of Patent: Jan. 31, 2017

(54) SCALING OF FILAMENT BASED RRAM

(71) Applicant: Crossbar, Inc., Santa Clara, CA (US)

(72) Inventor: Sung Hyun Jo, Sunnyvale, CA (US)

(73) Assignee: Crossbar, Inc., Santa Clara, CA (US)

(*) Notice: Subject to any disclaimer, the term of this patent is extended or adjusted under 35 U.S.C. 154(b) by 0 days.

(21) Appl. No.: 14/839,442

(22) Filed: Aug. 28, 2015

Related U.S. Application Data

(62) Division of application No. 13/958,468, filed on Aug. 2, 2013, now Pat. No. 9,153,624.

(60) Provisional application No. 61/785,926, filed on Mar. 14, 2013.

(51) Int. Cl.
*H01L 45/00* (2006.01)
(52) U.S. Cl.
CPC .............. *H01L 45/14* (2013.01); *H01L 45/08* (2013.01); *H01L 45/1233* (2013.01); *H01L 45/1253* (2013.01); *H01L 45/146* (2013.01); *H01L 45/147* (2013.01); *H01L 45/148* (2013.01); *H01L 45/16* (2013.01)
(58) Field of Classification Search
CPC ........ H01L 45/146; H01L 45/04; H01L 45/16; H01L 27/2436; H01L 27/2463; H01L 45/1233; H01L 45/1253; H01L 45/147; H01L 23/481; H01L 27/2481; H01L 45/08; H01L 45/085; H01L 45/1226; H01L 45/144
USPC ........ 438/102, 382, 396, 385, 330; 257/1–4, 257/E45.002, E29.087, E21.068
See application file for complete search history.

(56) References Cited

U.S. PATENT DOCUMENTS

| 5,627,451 | A | 5/1997 | Takeda |
| 7,667,442 | B2 | 2/2010 | Itoh |
| 7,704,788 | B2 | 4/2010 | Youn et al. |
| 7,830,698 | B2 | 11/2010 | Chen et al. |
| 8,502,185 | B2 * | 8/2013 | Lu .......................... H01L 27/101 257/296 |
| 8,586,958 | B2 * | 11/2013 | Sakamoto .......... G11C 13/0009 257/3 |
| 8,664,632 | B2 * | 3/2014 | Matsushita ........... H01L 45/085 257/4 |

(Continued)

OTHER PUBLICATIONS

R C Newman, Defects in silicon, Rep. Prog. Phys., 1982, pp. 1165-1206, vol. 45, The Institute of Physics, Great Britain.
(Continued)

*Primary Examiner* — Andres Munoz
(74) *Attorney, Agent, or Firm* — Amin, Turocy & Watson, LLP

(57) ABSTRACT

A solid state memory comprises a top electrode, a bottom electrode and an insulating switching medium that is disposed at a thickness based on a predetermined function. The insulating switching medium generates a conduction path in response to an electric signal applied to the device. The thickness of the insulating switching medium is a function of a filament width of the conduction path and operates to prevent rupture of a semi-stable region. The semi-stable region maintains filament structure over time and does not degrade into retention failure. The solid state memory can comprise one or more conducting layers that can operate to control the conductance at an on-state of the memory and offer oxygen vacancies or metal ions to the switching medium. The function of the thickness of the insulating switching medium can vary depending upon the number of conduction layers disposed at the insulating switching medium.

26 Claims, 10 Drawing Sheets

(56) References Cited

U.S. PATENT DOCUMENTS

| | | | |
|---|---|---|---|
| 8,785,288 B2 * | 7/2014 | Sandhu | H01L 45/04 257/E21.004 |
| 8,916,848 B2 * | 12/2014 | Fujii | G11C 13/0007 257/2 |
| 2006/0286762 A1 | 12/2006 | Tseng et al. | |
| 2007/0069119 A1 | 3/2007 | Appleyard et al. | |
| 2007/0171698 A1 | 7/2007 | Hoenigschmid et al. | |
| 2008/0019163 A1 | 1/2008 | Hoenigschmid et al. | |
| 2008/0165571 A1 | 7/2008 | Lung | |
| 2008/0278988 A1 | 11/2008 | Ufert | |
| 2008/0301497 A1 | 12/2008 | Chung et al. | |
| 2009/0014707 A1 | 1/2009 | Lu et al. | |
| 2009/0302296 A1 * | 12/2009 | Fuchigami | H01L 45/08 257/2 |
| 2009/0321706 A1 | 12/2009 | Happ et al. | |
| 2010/0237314 A1 | 9/2010 | Tsukamoto et al. | |
| 2010/0277969 A1 | 11/2010 | Li et al. | |
| 2011/0180775 A1 | 7/2011 | Lin et al. | |
| 2011/0204314 A1 | 8/2011 | Baek et al. | |
| 2011/0305064 A1 * | 12/2011 | Jo | G11C 13/0002 365/148 |
| 2011/0310656 A1 | 12/2011 | Kreupl et al. | |
| 2013/0175494 A1 * | 7/2013 | Collins | H01L 45/085 257/4 |

OTHER PUBLICATIONS

Office Action dated Sep. 17, 2014 for US. Appl. No. 13/958,468, 19 pages.

\* cited by examiner

SCALING OF FILAMENT BASED RRAM

CROSS REFERENCE TO RELATED APPLICATIONS

The present application for patent is a divisional application of U.S. patent application Ser. No. 13/958,468 entitled SCALING OF FILAMENT BASED RRAM and filed Aug. 2, 2013, which claims the benefit of priority to U.S. Provisional Patent Application Ser. No. 61/785,926 entitled SCALING OF FILAMENT BASED RRAM and filed Mar. 14, 2013, the respective entireties of which are hereby incorporated by reference herein for all purposes.

TECHNICAL FIELD

The subject disclosure relates generally to resistive random access memory (RRAM) technology, and more particularly to scaling of the filament for RRAM technology.

BACKGROUND

Resistive switching elements can operate as viable alternatives to various memory cell technologies, such as metal-oxide semiconductor (MOS) type memory cells employed for electronic storage of digital information. Models of resistive-switching memory devices provide some potential advantages over non-volatile FLASH MOS type transistors, including smaller die size, higher memory density, faster switching (e.g., from a relatively conductive state to a relatively non-conductive state, or vice versa), good data reliability, low manufacturing cost, and others.

In particular, resistive random access memory (RRAM) can hold substantial advantages over competing technologies in the semiconductor electronics industry, such as for high density non-volatile storage. An RRAM device has an insulator layer that is provided between a pair of electrodes and exhibits electrical pulse induces hysteretic resistance switching effects. Filaments can be formed between the electrodes by a diffusion and (or) drift of ions that reduce the resistance of the structure and remain after being induced, which gives the device a non-volatile characteristic. The ions can then be removed by a reverse flow of the ions, and thus, enable a controllable resistive nature. However, in the sub 100 nanometer size, the filaments can become unstable over time causing a disruption in the retention capability of the device.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Aspects of the subject disclosure relate to memory cells, such as a solid state memory cell. A memory cell can include a top electrode and a bottom electrode that is opposite to the top electrode. A switching medium layer is disposed between the top electrode and the bottom electrode, and conductive path (filament) forms therein. According to various embodiments, a conductive layer, such as a metal oxide layer and/or a conductive semiconductor layer, can be disposed within the memory cell. The conductive path can, for example, traverse a top surface of the bottom electrode, and/or a bottom surface of the top electrode, in which each conductive layer (or tunnel layer—herein a conductive layer includes the tunnel layer) can independently comprise the metal oxide layer and/or the conductive semiconductor layer. The switching medium facilitates a formation of the conductive path through an application of an electric signal, and further comprises a thickness that is a function of a filament thickness (length) of the conductive path.

Methods disclosed herein relate to fabricating a solid state memory cell. The solid state memory cell can comprise an RRAM cell, for example, such as a metal oxide based RRAM, an oxide based RRAM, a solid electrolyte based RRAM, or an amorphous silicon RRAM. In particular aspects, such a method can comprise forming a bottom electrode layer. A non-conductive layer is formed as a switching medium coupled to the bottom electrode and having a thickness. A top electrode layer is formed opposite to the bottom electrode, which are both coupled to the switching medium. The method further comprises generating a conductive path through the non-conductive layer that comprises a filament width in response to an electric signal, in which the thickness of the non-conductive layer is a function of the filament thickness.

In still other aspects of the subject disclosure, provided is an electronic device. The electronic device can comprise an electronic memory unit, further comprising one or more arrays of solid state memory cells configured to store digital information. Particularly, the solid state memory cells can comprise a pair of electrodes respectively configured to conduct electricity at a first electrical resistance and an insulating switching medium configured to conduct electricity at a second electrical resistance that is different than the first electrical resistance. Further, the solid state memory cells can comprise a semi-stable conductive filament within a portion of the insulating switching medium in response to an electrical field. The semi-stable conductive filament comprises a filament width, and the insulator switching medium comprises a thickness that is a predetermined function of the filament width and further configured to stabilize the semi-stable conductive filament from a rupture or a retention failure.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

DETAILED DESCRIPTION

Figure 1:
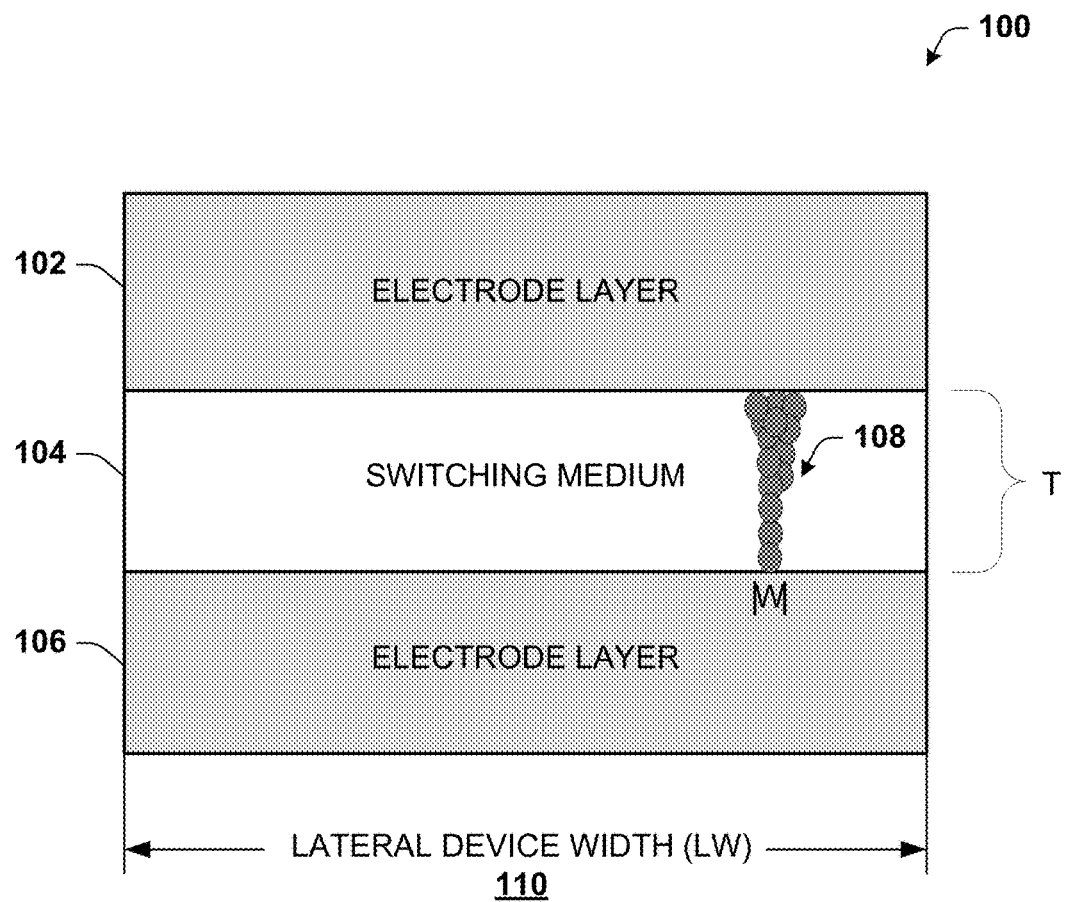
FIG. 1 illustrates a block diagram of an example solid state memory device exhibiting a switching medium formation according to disclosed aspects.

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

This disclosure relates to memory cells, and, in particular resistive switching memory cells, such as resistive switching two-terminal memory cells, in various embodiments. The resistive switching two-terminal memory cells (also referred to as resistive switching memory cells), as utilized herein, comprise circuit components having two electrical contacts (also referred to herein as electrodes or terminals) with an active region between the two conductive contacts. The active region of the two-terminal memory device exhibits a plurality of stable or semi-stable resistive states, each resistive state having different electrical resistance, which can be retained and re-programmed within the cell. Moreover, respective ones of the plurality of states can be formed or activated in response to a respective voltage difference applied at the two conductive contacts. An example of a resistive switching two-terminal memory device, though not exhaustive, can include a resistive random access memory (RRAM).

Various types of resistive switching memory cells are envisioned as having various types of switching mediums, such as layered amorphous silicon (a-Si), metal oxides and silicon oxides, as well as other materials. Resistive-switching devices can have, for example, a three-layer arrangement of metal/insulator/metal, which can include a-Si resistive switching device having a metal/a-Si/metal arrangement. The a-Si layer essentially serves as a digital information storage medium, and can also be referred to as a resistive switching layer (RSL), resistive switching medium (RSM), a switching medium, an inducting switching medium, or the like. The insulator layer or switching medium layer, as referred to herein, can include other materials as well, such as oxides, solid electrolyte materials, etc.

Resistive-switching memory can include, for example, a filamentary-based memory cell, which in turn can include: a p-type or n-type silicon bearing layer (e.g., p-type or n-type polysilicon, p-type or n-type SiGe), an undoped silicon bearing layer (e.g., having intrinsic characteristics), and an active metal layer for providing filament forming ions to the amorphous silicon layer (e.g., silver (Ag), copper (Cu), gold (Au), titanium (Ti), nickel (Ni), aluminum (Al), chromium (Cr), iron (Fe), manganese (Mn), tungsten (W), vanadium (V), cobalt (Co), platinum (Pt), and palladium (Pd)). In some disclosed embodiments, a memory cell can comprise one or more of the foregoing layers, a subset of these layers, or none of these layers, or other layers detailed herein.

The memory cells disclosed herein can have a variety of different resistive switching cell technologies. For instance, the different technologies can include different discrete programmable resistances, different associated program/erase voltages, as well as other differentiating characteristics. For instance, a unipolar resistive-switching memory cell, once initially programmed, can be later erased in response to a first positive voltage (e.g., three volts) and programmed in response to a second positive voltage (e.g., between four and five volts). Bipolar resistive-switching memory cells, on the other hand, become programmed in response to a positive voltage and erased in response to a negative voltage. Where no specific resistive-switching technology or program/erase voltage is specified for the various aspects and embodiments herein, it is intended that such aspects and embodiments incorporate any suitable memory cell technology and be operated by program/erase voltages appropriate to that memory cell technology. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

Two-terminal memory cells have several advantages. For instance, resistive-switching memory technology can generally be smaller, typically consuming silicon area on the order of $4F^2$ per adjacent resistive-switching device (e.g., a memory cell comprising two resistive-switching devices would therefore be approximately $8F^2$ if constructed in adjacent silicon space) where F stands for the minimum physical feature size of a specific technology node. Non-adjacent resistive-switching devices, e.g., stacked above or below each other, can consume as little as $4F^2/n$ for a set of multiple non-adjacent devices where n is the number of stacked memory layers. Such can lead to greater semiconductor component density and memory density, and low manufacturing costs for a given number of transistors relative to competing technologies. Resistive-switching memory also has very fast programming and/or switching speed along with a relatively low programming current. Additionally, resistive-switching memory is non-volatile memory, having the capacity to store data without continuous application of power.

To program a filamentary-based resistive switching memory cell, a suitable program voltage Vprogram can be applied across the memory cell causing a conductive filament to form through a resistive, or dielectric, portion of the memory cell. This causes the memory cell to switch from a relatively high resistive state, to a relatively low resistive state. An erase process can be implemented to reverse the process, at least in part, causing the memory cell to return to the high resistive state from the low resistive state. This change of state, in the context of memory, can be associated with respective states of a binary bit. Accordingly, multiple such memory cells can be programmed or erased to represent respective zeroes or ones of binary information, and by retaining those states over time, can in effect facilitate storing binary information. In various embodiments, multi-level information (e.g., multiple bits) may be stored in such memory cells. For various reasons, two-terminal memory cells are generally quick to program and responsive, changing state readily in response to a program voltage. This quick switching of state is a significant advantage of resistive-switching memory cells over other memory cell technologies.

Viewed broadly, resistive switching memory cells have the potential to replace other types of memory technologies for various memory applications, due to the numerous advantages over competing technologies. However, a difficulty that can exist includes retention capability in filamentary-based cells with filaments in the sub 100 nm diameter range that have lower programming currents. RRAMs, for example, are based on a conducting filament formation that is operational in an on-state, or a high conductance state, as opposed to removal or rupture of the filament formation in an off-state, or a relative low conductance state. These mechanisms are incorporated for the resistive switching memory cells, or solid state memory cells (e.g., RRAMs) discussed here even though different physical mechanisms are involved for cells with different switching mediums. A ruptured filament for resistive switching memory cells can occur as part of the structural evolution of the filament, which can undermine reliability of the device.

Overview

In various embodiments disclosed, a memory cell is configured to maintain the filament as programmed, or in a stable state, without retention failure occurring by a filament rupture. The memory cell comprises a switching layer that is disposed between electrodes based on a function of the filament diameter and a filament length that forms within the switching layer. The diameter of the filament, for example, can be smaller than 50 nanometers, and/or smaller than 10 nm when the programming current applied is controlled. The filament (conductive path) that forms within the switching medium can evolve structurally and eventually rupture. The switching medium is configured to stop structural evolution from advancing to a point of rupture within the filament, and thereby, resulting in retention failure of the programmed resistance.

For example, the switching medium can be configured based on a prediction of the filament structural evolution, which results from a formation towards minimum free energy. In particular, the nanometer scale filament within the switching medium results toward minimum surface energy. The memory cell is configured with the switching medium as a function of the minimum surface energy that results from a structural evolution to stop rupture of the filament and loss of retention capability throughout the life of the cell.

The conductive path, for example, can comprise a first surface area comprising a cylindrical surface area with a cylindrical radius, which is half of the filament width at a first point in time. The conductive path operates to change toward an evolved structure having the lowest surface energy possible within the switching medium at a second point in time. The conductive path in the evolved structure comprises a second surface area comprising a set of spherical surface areas (one or more spherical surface areas) with a spherical radius at a second point in time. The spherical surface area of the set is not less than the cylindrical surface area, and provides continued stability to the memory cell. Further details of the embodiments are discussed below with reference to the drawings.

Examples of Scaling of Filament Based RRAM

Referring to FIG. 1, illustrated is an example memory cell or memory device that exhibits a filament formation, according to various aspects of the subject disclosure. The solid state memory device comprises a stack 100 of multiple solid layers. The stack 100 can comprise a first electrode layer 102, a switching medium 104, a second electrode layer 106, and a conductive path 108.

The stack 100 of the memory cell is placed in an ON state by applying a program voltage Vp to the first electrode layer, as illustrated. In some alternative embodiments, the memory cell can be placed in the ON state by applying the program voltage Vp, or another suitable voltage Vp' (e.g., −Vp for a bipolar memory cell) to the second electrode layer 106. The switching medium 104 is provided between the first electrode 102 and the second electrode 106. A conductive path can be formed within switching medium 104 in response to a suitable electric signal (e.g., an electric field or voltage, a current, and so forth) applied to the device. The electric signal applied across the switching medium 104 can induce a diffusion or drift of ions (e.g., metal ions) from the first electrode layer 102 toward the second electrode layer 106, or vice versa, from the second electrode layer 106 toward the first electrode layer 102, based on a location of an electro deposition, and/or other process parameters. In certain implementations, the conductive path can be formed in multiple steps, the application of different electric signals for different regions within the conductive path 108, resulting in a stable region and a semi-stable region (not show) of the conductive path 108.

The switching medium 104 can be comprised of various materials. For example, the switching medium 104 can be any suitable material having high electrical resistance and having at least partial permeability (e.g., in response to an electric signal) to ions of conductive ion layer 102 or ions that are generated within the switching medium (e.g. metal or oxygen ions). In addition, the material employed for electrically resistive diffusive layer 104 can be compatible with semiconductor fabrication processes (e.g., stacking, etching, masking, deposition, . . . ). Examples of such a material can include an amorphous silicon (a-Si) material, a chalcogenide, a silicon on glass, an oxide such as titanium oxide (TiOx), tantalum oxide (TaOx), silicon dioxide (e.g., $SiO_2$), silicon sub-oxide (e.g. SiOx), Hafnium Oxide ($HfO_x$), Nickel Oxide ($NiO_x$), Tungsten Oxide ($WO_x$), Aluminum Oxide ($AlO_x$), Copper Oxide ($CuO_x$), Germanium Oxide ($GeO_x$), Silicon Germanium Oxide ($Si_xGe_yO_z$), Silicon Oxi-Nitride ($SiO_xN_y$), Silver Germanium Selenide ($Ag_xGe_ySe_z$), Silver Selenide ($Ag_2Se$), Copper Sulfite ($Cu_2S$), other oxide, or a suitable combination thereof, which is at least in part porous with respect to the particles, ions or the like. In various aspects of the subject disclosure, the switching medium 104 can be less than a hundred nanometers in thickness. In particular aspects, the switching medium 104 can be about a fifty nm in thickness, or less. In at least one aspect, electrically resistive diffusive layer 104 can be selected from between about ten nanometers thick and about two nanometers thick or less.

Metal electrode layer 106 can be a suitable metal conductor for a memory cell. Examples can include aluminum, copper, tungsten, titanium, silver, platinum, palladium, suitable compounds thereof, or the like, or suitable combinations of the foregoing. In at least one aspect, metal electrode layer 106 can be a metal bitline, metal wordline, metal dataline, . . . , of a memory array. For instance, metal electrode layer 106 can be a metal bitline or metal wordline in a fundamental crossbar memory array (e.g., see FIG. 7 and related description, infra). The general purpose of metal electrode layer 106 is to facilitate memory operations, such as a program operation, read operation, erase operation, . . . , for a memory cell comprising stack 100. Metal electrode layer 106 can be connected to a sensing circuit (e.g. CMOS circuitry, not depicted) to measure current or voltage of stack 100 in conjunction with reading a state of stack 100, for instance.

The conductive path 108, for example, can comprise a series of metal particles that are trapped within the switching medium 104 when a program voltage applied provided sufficient activation energy to force a number of metallic particles from the first electrode 102 to the second electrode 106. At least a portion of the conductive path 108 can be comprised of particles separate from each other by the switching medium 104. Because the switching medium 104 operates as an insulator, the switching medium 104 is resistant to the formation of a continuous conductive path for the ionized particles.

In at least one disclosed embodiment, the conductive path 108 comprises a filament width (W) that can be less than 100 nm (e.g., less than 50 nm or less than 10 nm) within a region of switching medium 104 that is in proximity to the second electrode 106 (or in proximity to the first electrode 102 in the case of a filament formed in a reverse formation from second electrode 106 to first electrode 102). The width (W) is determined at an area of the conductive path (or filament region) 108 proximate to the second electrode 106, for example, and can extend across a thickness (T) of the switching medium 106, or partially extend across the thickness (T). When the stack 100 operates in the ON state electrons can conduct through the filament width (W) of the conductive path 108. The device resistance, for example, can be predominately determined by the tunneling resistance between a particle and the second electrode 106, for example, and, in particular, the particles closest to the second electrode 106 of the conductive path 108.

In one embodiment, the thickness (T) of the switching medium 104 operates as a predetermined function of the filament width (W) at the region of the conductive path that is closest to the opposite electrode (e.g., second electrode 106) and is also semi-stable. For example, the thickness of the switching layer 104 can be tuned so that the free energy of the conductive path 108 at a first point in time is less than a different free energy of the conductive path at a second point in time. In this case, the filament can last to infinity without structural changes of the filament in the switching medium, hence offering reliable data retention. The first and second free energies, for example, can be represented by a first and a second surface energies, hence surface areas of the particles comprising the filament and semi-stable portions of the conductive path 108. In another embodiment, the thickness (T) is a function of a multiple times the filament width or diameter. For example, the switching medium 104 can be disposed based on a thickness (T) according to the equation: (T)<2.2(W).

In another embodiment (not illustrated to scale), the multiple comprising at least one of about 2.2 and the lateral device size (illustrated as lateral device width 110, or LW 110) is substantially equivalent to the filament width W, about 1.1 and the filament width W is about a half of the lateral device width LW 110, or the multiple is about 0.5 and the filament width W is about a quarter of the lateral device width LW 110. In another embodiment, the filament width W along a point along the length of the conductive path 108 in which the insulator switching medium comprises the thickness T that is a predetermined function of the filament width W and configured to stabilize the conductive path 108 (or region therein) from a rupture or a retention failure. The predetermined function can comprise the thickness T as being less than a multiple of the lateral device width LW 110 or width of the stack 100. For example, the multiple can comprise about 2.2 when the lateral device size LW 110 is substantially equivalent to the filament width W. The multiple can comprise about 1.1 when the filament width W is about a half of the lateral device width LW 110, or the multiple can be about 0.5 when the filament width W is about a quarter of the lateral device width LW 110.

Figure 2:
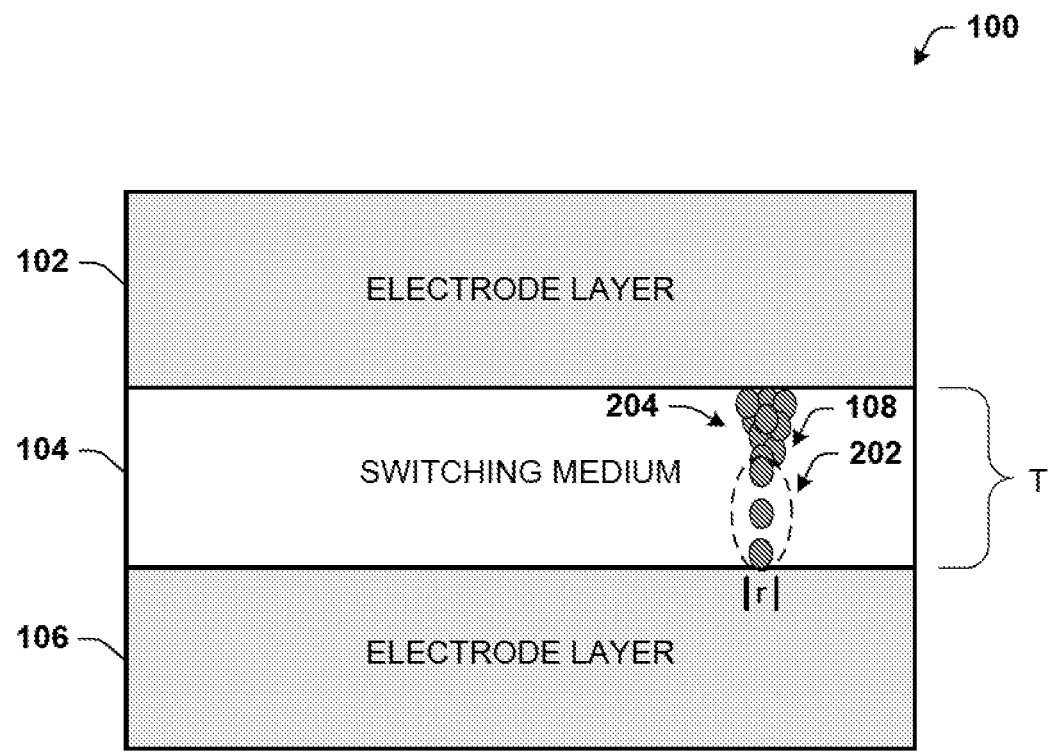
FIG. 2 illustrates a block diagram of the example solid state memory device with structural evolution of a formed filament.

Referring now to FIG. 2, illustrated is an example of the stack 100 with respect to a structural evolution, according to various aspects of the subject disclosure. The memory device 100 comprises multiple solid layers comprising the first electrode layer 102, the switching medium 104, the second electrode layer 106, and the conductive path 108, as discussed above. The conductive path 108 further comprises a semi-stable region 202 that is not stable without the switching medium 104 being configured according to a predetermined function.

The conductive path 108 can result in the memory cell 100 being in an Off-state and no longer stable as a result of the structural evolution from an initial programmed time to a second time point past a point of stability within the conductive path 108. The conductive path 108, for example, can comprise a stable region 204 and an un-stable region 202 that can structurally evolve into an unstable state at another point in time. The region 202 comprises one or more ruptures within the structural integrity of the conductive path 108. As a result of the particles within the conductive path moving toward a state of minimal free energy (or minimum surface energy/surface tension), the switching medium 104 can cause the particles of the conductive path 108 to rupture and separate at a sufficient distance a part to no longer retain the programmed state. As a result of the altered region 202, the cell 100 is no longer able to retain the resistance that was initially programmed by the electric signal.

In one embodiment, the switching medium (T) is disposed within the cell to account for the structural evolution of the conductive path 108. During the structural evolution of the conductive path 108, the volume of the semi-stable region 202 of the filament, which comprises at least a portion of the conductive path 108 or the entire conductive path 108, can be preserved by accounting for the changes in the unstable region. The conductive path 108 in an initial programmed state of the, as illustrated in FIG. 1, can be compared to the conductive path 108 at a different point in time, for example, after structural evolution has occurred, such as illustrated in FIG. 2, and a function derived for disposing the switching medium 104 to account for such changes.

Because the effects of gravity can be negligible within a nano-structure such as the conductive path 108, the surface energy (surface tension) can dominate the stability of the nano-sized structure. A conductive path 108 or semi-stable portion 202 of the conductive path 108 can be modeled according to the structural evolution that undergoes based on the surface energy. The surface energy of the conductive path 108 is proportional to the surface area. Consequently, the conductive path 108 becomes unstable and loses retention capability by a cylindrical filament surface are per unit of filament length (λ in FIG. 3) being greater than a spherical surface area per unit length, in which the initial programming state of the cell includes the cylindrical surface are and the evolved structure includes the spherical surface area. The semi-stable region 202 of the conductive path 108, therefore, becomes unstable under the follow condition: a unit cylindrical volume of the filament at time $T_1$/a unit spherical volume of the filament at time $T_2$ The switching medium 104 is configured then to account for a change in the structure of the conductive path with respect to time. For example, the thickness (T) of the switching medium 104 disposed between the electrode layer 102 and the electrode layer 106 is dependent upon the thickness of the conductive path (W) with respect to time.

Figure 3:
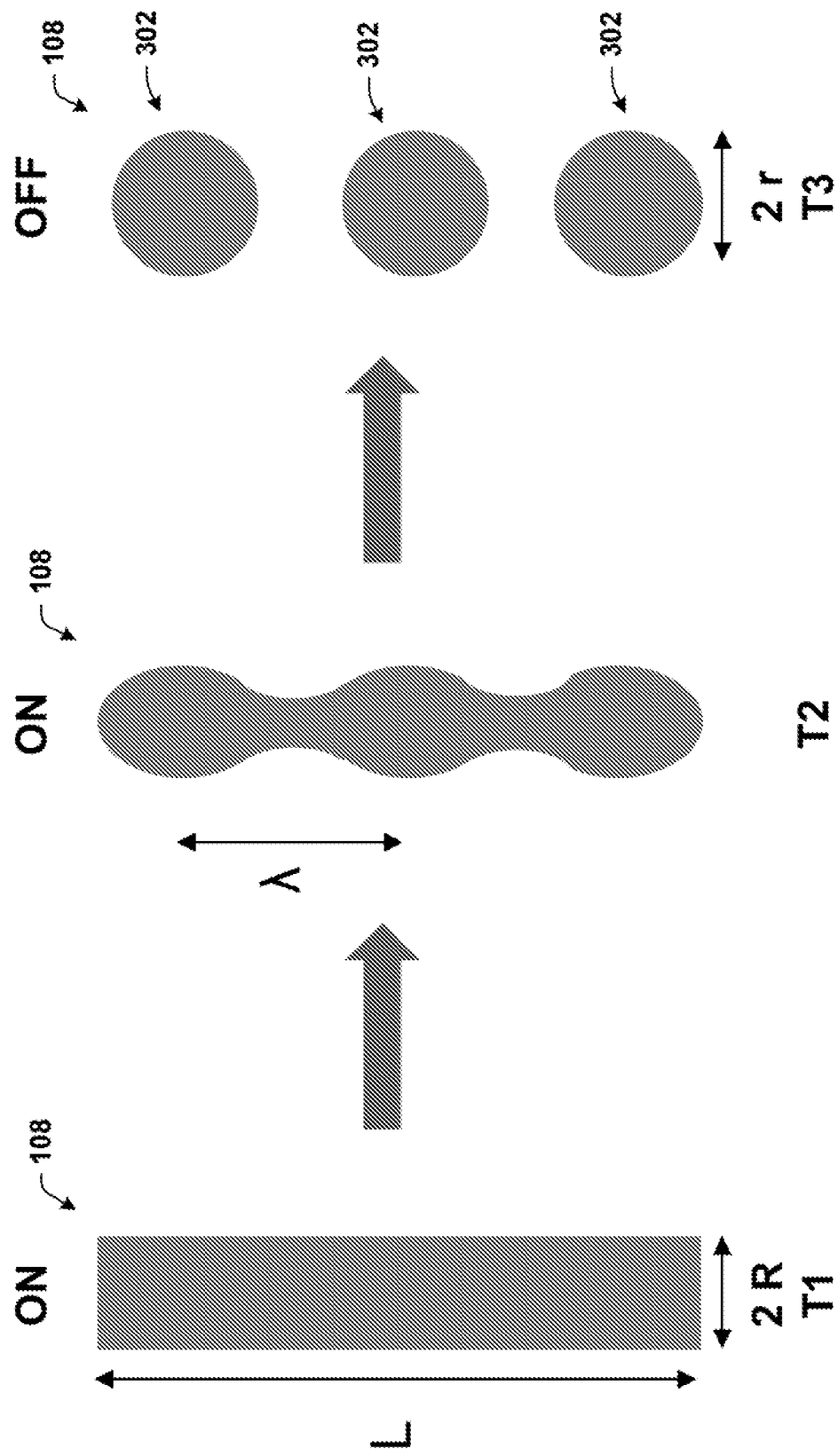
FIG. 3 illustrates a block diagram of an example filament structural evolution with respect to time formation and partial deformation to facilitate switching medium thickness in some aspects.

Referring to FIG. 3, illustrated is a structural evolution of the conductive path 108 of a memory cell in accordance with various aspects disclosed. The conductive path 108 is represented structurally at three different times, T1, T2 and T3. T1 comprises the initial On-state as programmed initially with a voltage applied electrical field for a predetermined resistance. Time T2 represents a second future time during structural evolution progression that is before time T3, which is at a time that structural evolution is complete. At T2 the structure of the filament or conductive path 108 is beginning towards a minimal free energy within the switching layer 104.

The filament portion of the conductive path 108 at T1 can be analyzed based on a cylindrical surface area per unit of length along the filament (λ), in which the unit of length represents a unit filament length that corresponds to a particle 302 center to another particle 302 center at time T3. The cylindrical surface area per unit of length at T1 and the spherical surface area per unit length at T3 can be compared with the condition of the atom conservation which means the filament volume is conserved during the structural evolution. Then the filament stability (data retention stability) depends on the comparison of the surface areas. In other words, the filament region or unstable region of at least a portion of the conductive path 108 is unstable if the following equation is satisfied:

$$4\pi r^2 / 2\pi R\lambda < 1 \qquad \text{(eqn. 1)},$$

where r is the radius of the evolve spherical particle 302 at time T3, R is the radius of the cylindrical filament at T1, L is the filament or conductive path length, and λ is the unit filament length corresponding to a particle 302 to another particle 302 at a point during the structural evolution from the time T2 to the time T3.

In order to conserve volume of the filament during structural evolution, in which an atom is not created/removed, the following equation will hold true:

$$\pi R^2 \lambda = (4/3)\pi r^3 \rightarrow r = [(3/4)R^2\lambda]^{1/3} \qquad \text{(eqn. 2)}.$$

Deriving from eqn. 1 and eqn. 2, a filament or semi-stable region of the conductive path 108 is unstable if the following equation is satisfied:

$$\lambda > 4.5R \qquad \text{(eqn. 3)}.$$

In one embodiment, the switching medium 104 can be disposed with a thickness (T) that is representative of the filament height or length L. The switching medium 104 is therefore disposed to retain a programmed state and not rupture far enough to cause retention failure by being disposed with a thickness (T) that is less than about 4.5 R, or, in other words, less than about 2.2 W, the width or diameter of the conductive path 108, for example. Although a structural evolution still occurs towards minimal free energy, the switching medium 104 with the semi-stable region of the conductive path 108 can operate to retain a programmed state throughout the structural change from T1 to T3.

Irrespective of the various fabrication technologies utilized for resistive-switching memory cells, a switching layer can be disposed according to a predetermined function derived from the structural evolution of the filament, the semi-stable region, or, in other words, the conductive path 108. As discussed above, resistive-switching memory cell devices or units can include, for example, a filamentary-based memory cell, which in turn can include: a p-type or n-type silicon bearing layer (e.g., p-type or n-type polysilicon, p-type or n-type SiGe), an undoped silicon bearing layer (e.g., having intrinsic characteristics), and an active metal layer for providing filament forming ions to the silicon bearing layer (e.g., silver (Ag), gold (Au), titanium (Ti), nickel (Ni), aluminum (Al), chromium (Cr), iron (Fe), manganese (Mn), tungsten (W), vanadium (V), cobalt (Co), platinum (Pt), and palladium (Pd)). In some disclosed embodiments, a memory cell can comprise one or more of the foregoing layers, a subset of these layers, or none of these layers, or other layers detailed herein. For example, the switching medium 104 can comprise at least one of amorphous silicon, amorphous silicon germanium, $TiO_x$, $TaO_x$, $HfO_x$, $NiO_x$, $WO_x$, $AlO_x$, $CuO_x$, $SiO_x$, $GeO_x$, $Si_xGe_yO_z$, $SiO_xN_y$, $Ag_xGe_ySe_z$, $Ag_2Se$, $Cu_2S$, an oxide and/or a chalcogenide that is at least in part porous with respect to ion particles that form a filament (the conductive path 108). In addition, the electrodes 102 and/or 106 an comprise at least one of silver (Ag), titanium (Ti), aluminum (Al), tungsten (W), copper (Cu), platinum (Pt), palladium (Pd), and/or titanium nitride (TiN) for providing filament forming ions to the switching medium 104 or for generating metal rich region within the switching medium. The conductive path 108, for example, can be comprised of metal ion particles or oxygen vacancies (when drift of oxygen ions in the switching medium attribute to the formation/rupture of filaments) in the switching medium 104, from the top or bottom electrode 102, 106, depending upon whether the memory cell is a metal oxide based RRAM, an oxide based RRAM, a solid electrolyte based RRAM, or an amorphous silicon based RRAM, for example. Further, the memory cell can comprise one or more conductive layers or tunnel layers, which can further alter filament dynamics and configuration of the switching medium as detailed in the below discussion.

Figure 4:
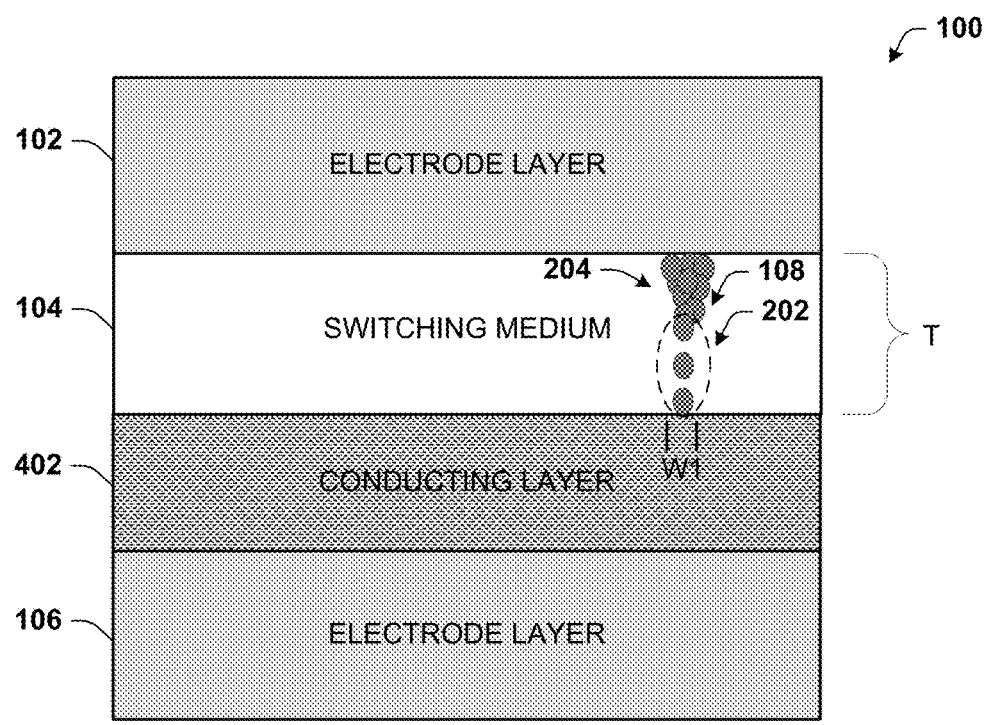
FIGS. 4 and 4A illustrate respective block diagrams of example solid state memory devices exhibiting a switching medium formation with an additional layer according to disclosed aspects.
Figure 4A:
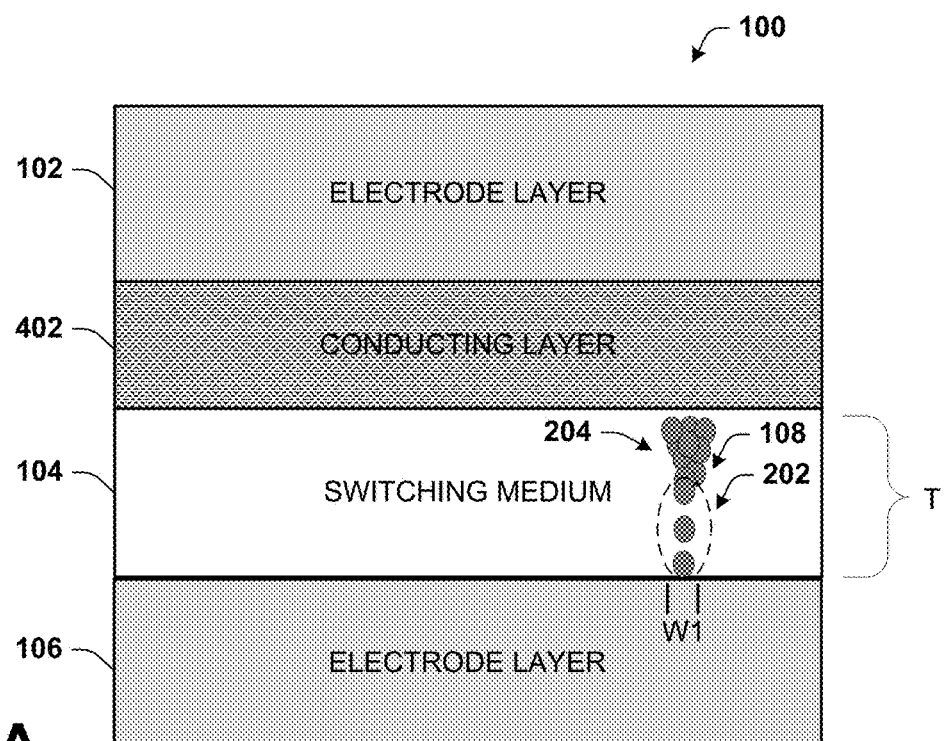

Referring to FIG. 4, illustrated is an example of a memory cell in accordance with various embodiments disclosed herein. The memory cell 100 comprises the top electrode 102, the switching medium 104, and the bottom electrode 106, as discussed above, and further comprises a conducting layer (or tunnel layer) 402. In one aspect of the disclosure, the switching medium 104 is configured to comprise a thickness T that is a function of a width W1 of the conducting path 108 and conducting layer(s) 402 disposed within the stack 100. For example, the switching medium 104 is based on the thickness T of the filament formation of the conducting path 108. The thickness is controlled based on the width W1 at a point along the conducting path 108 and whether a first conducting layer 402 is disposed within the stack 100 and/or additional layers are disposed within the stack 100.

In one example, the switching medium 104 has a thickness T that is a function of the width W1 of the semi-stable region 202 of the conducting path 108 and also of the stack 100 having one additional conducting layer 402. The conducting layer 402 can be located between the top electrode layer 102 and the switching medium 104, and/or the bottom electrode layer 106 and the switching medium 104, for example, in which the disclosure is not limited to any one particular processing order and/or configuration.

The conducting layer 402, for example, can include any optional extra layer such as an insulating medium, a thin tunnel layer and/or a conductive semiconductor layer, which is disposed between the switching medium 104 and the bottom electrode layer 106. Although the conducting layer 402 is located above the electrode layer 106 and below the switching medium 104, the conducting layer 402 can alternatively or additionally be disposed above the switching medium 104 and below the top electrode layer 102 based on design specifications as stated above. The conducting layer 402 can operate as a contact layer that is positioned between a pair of metal electrodes (e.g., electrode layer 102 and electrode layer 106) and the switching medium 104. The conducting layer 402 can be configured, for example, to improve physical and/or electrical continuity between the switching medium 104 and metal electrode layers 106 and 102 (e.g., providing good continuity from switching medium 104, to the conducting layer 402, and to metal electrode layer 102 and/or 106). The conducting layer 402 as a contact layer, for example, can be a doped semiconductor structure (e.g., polysilicon, $Si_xGe_y$—where x and y are suitable positive numbers), such as a p-doped silicon layer, for example, or other type, such as an n-doped silicon layer.

In alternative or additional aspects of the subject disclosure, stack 100 can comprise the conducting layer 402 that can operate further as an insulation barrier layer between electrode layer 102/electrode layer 106 and the switching medium 104. The conductive layer 402 can be configured to shield the switching medium 104 from contaminants, oxygen, or the like and operate as a non-metallic layer, having no metal within, which can be a thin barrier to block any metal to metal short from occurring.

The stack 100 is configured to retain stability of the filament 108 and prevent, stop and/or maintain the programmed On-state at T1 from degrading structurally into an Off-state or a complete rupture that causes a loss of the cell's retention capability without re-programming. Having a single conducting layer 402 within the stack 100 can affect the stability of the memory cell differently than having no additional layers, or when having more layers disposed within the cell. The switching medium 104 thus comprises a thickness T that is based on a thickness of the conductive path 108 and on the conductive layer. For example, the switching medium 104 can be disposed within the stack 100 according to a spherical area of at least a part of the conductive path 108 at a point in time (e.g., T3, or T2) and a cylindrical surface area of at least a part of the conductive path 108 (e.g., a semi-stable region, the entire conductive path, or the like) at a different time or at a same time as the spherical surface area in other cases.

In one embodiment, the cylindrical surface area is determined based on the area of the conductive path 108 contacting the conducting layer 402, so that the cylindrical surface area is determined as $2\pi R\lambda + a\pi r^2$, in which the variable a is expressed as the condition $a \geq 1$; and $a=1$, if flat top/bottom cylinder. In other words, if only one additional semiconducting/tunneling layer is disposed in the stack 100 as the conducting layer 402 into either between the top electrode 102 and the switching medium 104, or the bottom electrode 106 and the switching medium, then $a \approx 1$. The switching medium is therefore a function of the filament width of the conducting path 108 and a number of conducting layers that the conducting path 108 is coupled to.

For example, in the case of having one conducting layer 402, the stack 100 is configured to be unstable and lead to structural rupture/memory retention loss, if a length of the conductive path 108 is greater than about 2.71R, in which 2R is W1. The relationship between the thickness of the switching medium 104, and the width W1 of the conducting path 108 and one additional conducting layer is shown as follows:

$4\pi r^2 < 2\pi R\lambda + a\pi r^2$, where $a \geq 1$; and $a=1$, if one conductive layer and there is a flat top/bottom of cylinder surface area, in which $\lambda$ is a unit length from sphere to sphere and can be equated to the thickness T, R is the cylindrical radius where 2R is represented as W1, and 2r represented as W1 in the illustration at a different point in time at a spherical radius.

The switching medium 104 is configured to stabilize the region of the conductive filament 108 from a rupture or a retention failure. In another embodiment, the conductive path 108 has a region (e.g., the semi-conductive filament 202, other portion, or the entire conductive path 108) having the width W1 that operates as a factor in disposing or controlling the thickness T of the switching medium (insulator switching medium) 104 based on a predetermined function of the filament width. The predetermined function can comprise the thickness T being less than a multiple of the lateral device width, or the width of filament W1, for example. The multiple can comprise about 2.2 when the lateral device size is substantially equivalent to the filament width W1 when no additional layers are present within the stack 100 (e.g., conducting layer 402), and about 1.1 when the filament width is about a half of the lateral device width under the same conditions without additional layers. The multiple is about 0.5 when the filament width is about a quarter of the lateral device width under the same conditions. However, with the conducting layer 402 being disposed between the switching layer 104 and either the electrode layer 102 or the electrode layer 106 the multiple of the predetermined function takes into account the surface area with the additional conducting layers. In other words, the stack 100 is configured to prevent rupture of the conductive path 108 through structural evolution over time when the predetermined function comprises the thickness T of the switching medium being less than the multiple of the device width (e.g., W, W1) with the top or bottom surface area of the filament or conductive path being taken into account due to the additional conducting layer 402.

For example, the predetermined function can comprise the thickness T being less than a multiple of the lateral device width, or the width of filament W1, in which the multiple can comprise about 1.4 when the lateral device size is substantially equivalent to the filament width W1, and about 0.7 when the filament width W1 is about a half of the lateral device width with one additional layer within the stack 100. Additionally or alternatively, the multiple is about 0.35 when the filament width is about a quarter or 25% of the lateral device width with one additional layer 402.

Figure 5:
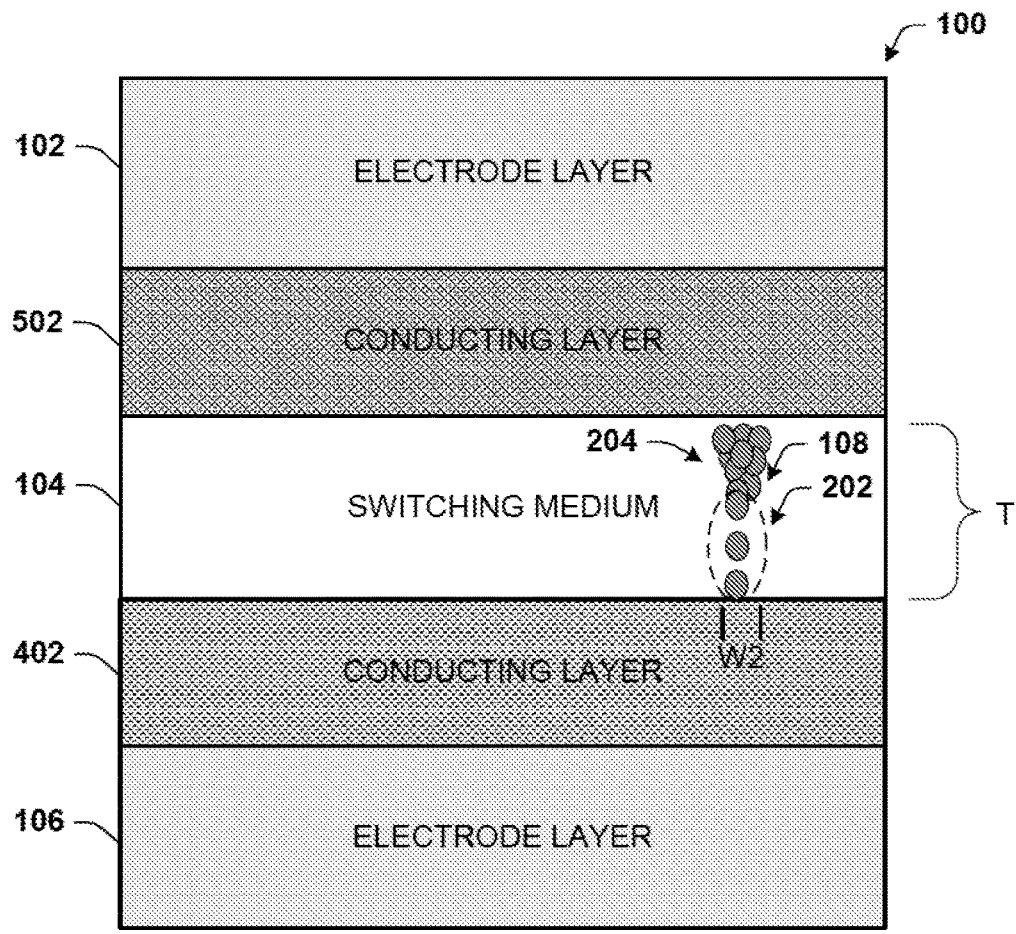
FIG. 5 illustrates a block diagram of an example solid state memory device exhibiting a switching medium formation with additional layers according to disclosed aspects.

FIG. 5 illustrates another example of a memory cell in accordance with various embodiments disclosed herein. The memory cell stack 100 comprises the top electrode 102, the switching medium 104, the bottom electrode 106, and the conducting layer 402 as discussed above, and further comprises another conducting layer 502, which is similar to the conducting layer 402 as discussed above and is operational as a tunneling insulating layer that controls a conductance of the solid state device in an On-state, a conducting semiconductor layer that controls the conductance of the solid state device in the On-state, or an oxygen vacancy metal oxide that provides an oxygen vacancy to the switching medium 104. The conducting layer 502 can operate as a contact layer that is positioned between a pair of metal electrodes (e.g., electrode layer 102 and electrode layer 106) and the switching medium 104. The conducting layer 502 can be configured, for example, to improve physical and/or electrical continuity between the switching medium 104 and metal electrode layers 106 and 102 (e.g., providing good continuity from switching medium 104, to the conducting layer 502, and to metal electrode layer 102 and/or 106). The conducting layer 502 as a contact layer, for example, can be a doped semiconductor structure (e.g., polysilicon, $Si_xGe_y$—where x and y are suitable positive integers), such as a p-doped silicon layer, for example, or other type, such as an n-doped silicon layer.

In one aspect of the disclosure, the switching medium 104 is configured to comprise a thickness T that is based on a function of a width W2 of the conducting path 108 and on the two conducting layers 402 and 502 being disposed within the stack 100. For example, the switching medium 104 is controlled based on the width W2 of the filament formation of the conducting path 108 and whether one or more conducting layers 402 are disposed within the stack 100.

In one example, the switching medium 104 includes a thickness T that is a function of the width W2 of a point along the conducting path 108 and a number (e.g., two) of additional layers residing within the stack 100. Both the conducting layer 402 and the conducting layer 502 are factored in the configuration of the stack 100 to prevent, stop and/or maintain structural degradation or evolution of the conductive path 108.

For example, the thickness T of the switching medium 104 is a function of the width W2 of the conducting path 108, which can be a different width than width W1 and/or the width W discussed above. Moreover, the thickness T can be disposed as a function of having two conducting layers that face or contact the switching layer and/or a function of a width W2 along the conducting path 108. The top/bottom surfaces of the cylindrical surface area at a programming On-state are factored into the predetermined function of the switching medium thickness T. For example, the thickness T of the conducting path 108 is based on W2 and also based on the thickness T or λ being less than 2r or W2. The conducting path remains stable when T or λ is less than about 2.44 R. For example, in the equation $4\pi r^2 < 2\pi R\lambda + a\pi r^2$, $a \approx 2$. The cylindrical filament shape of the conductive path 108 evolves into a spherical structure, and thus, remains stable if T or λ is less than about 2.44 R, in which 2R is W2, but becomes unstable if λ is more than about 2.44 R.

The switching medium 104 is configured to stabilize the region of the conductive filament 108 from a rupture or a retention failure based pm a predetermined function that controls the switching medium thickness T. For example, the predetermined function can comprise the thickness T being less than a multiple of the lateral device width, or the width of filament W2, in which the multiple can comprise about 1.2 when the lateral device size is substantially equivalent to the filament width W2, and about 0.6 when the filament width W2 is about a half (or 50%) of the lateral device width (e.g., the cell 100 width) with one additional layer within the stack 100. Additionally or alternatively, the multiple is about 0.3 when the filament width is about a quarter or 25% of the lateral device width with two additional layers (e.g., conducting layer 402 and conducting layer 502).

In another embodiment, the conducting layers 402 and 502 can independently comprise at least one of a tunneling insulating layer that controls a conductance of the solid state device in an on-state, a conducting semi-conductor layer that controls the conductance of the solid state device in the on-state, or an oxygen vacancy metal oxide that provides an oxygen vacancy to the switching medium. For example, the conducting layers 402 and 502 can both comprise a semi-conducting layer, or both comprise a metal oxide. Alternatively, one layer can be different from the other so that two different layers are disposed within the stack 100.

Figure 6:
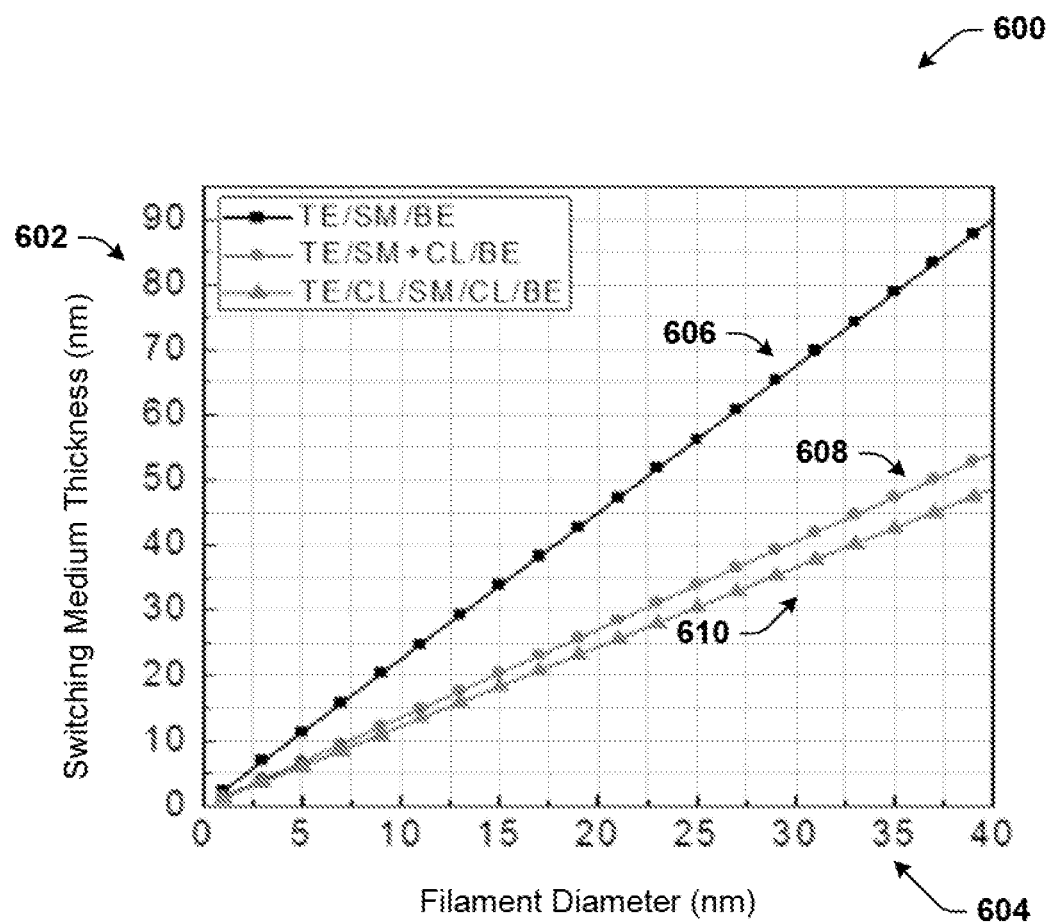
FIG. 6 illustrates a plot diagram of an example filament length relationship to filament diameter for solid state memory according to various aspects of the subject disclosure.

Referring to FIG. 6, illustrated is a graphical plot representation of filament parameters in accordance with various embodiments described herein. The plot representation 600 is defined by switching medium thickness 602 in nanometers along the y-axis and filament diameter in nanometers along the x-axis. A first plot 606 represents data points of the filament/conducting path parameters in a memory cell having a top electrode (TE), a switching medium (SM) and a bottom electrode (BE). A second plot 608 represents data points of the filament parameters in a memory cell having the TE, the SM, a conducting layer (CL) and the BE. A third plot 610 illustrates data points of filament parameters with two CLs between the TE, the SM and BE.

For example, the first plot 606 illustrates a stability line that is at approximately a multiple of 4.5 times R, or the filament cylindrical radius at programming. The second plot 608 illustrates a stability line from the data points at 2.7 R, and the third plot illustrates a stability line from the data points of 2.4 R. Thus, an inducting switching layer thickness is stable at any point below each stability line or plot under the conditions of the memory structure or based on the number of conducting layers within the structure.

Figure 7:
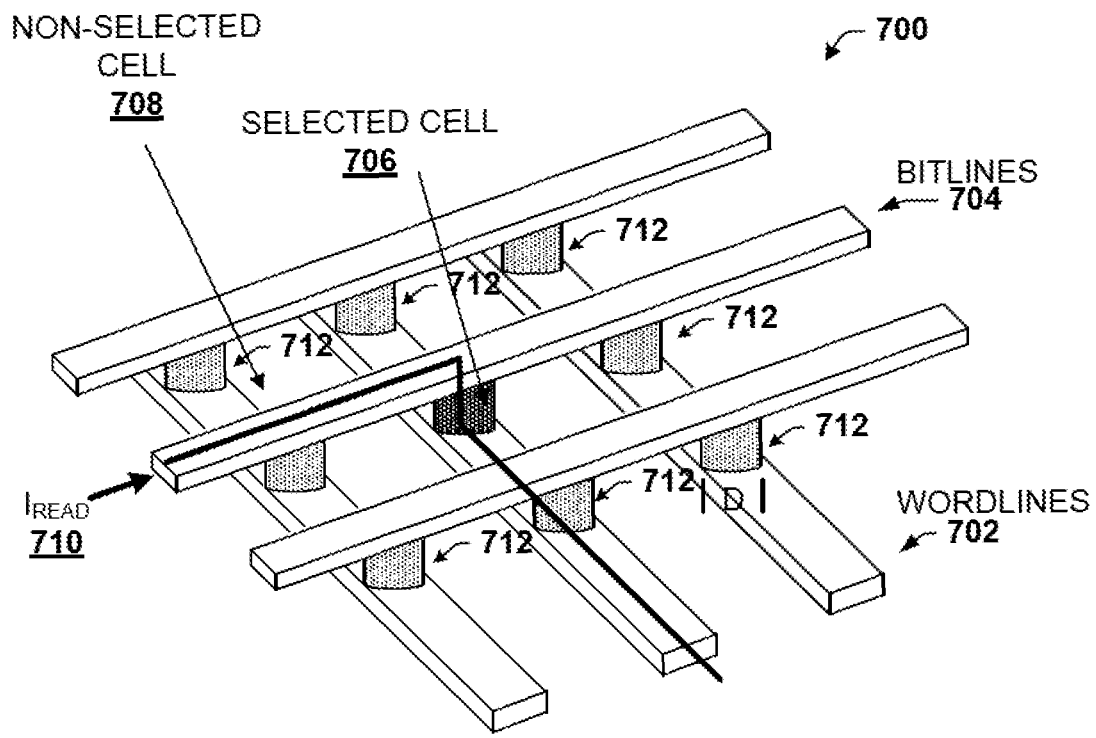
FIG. 7 illustrates a block diagram of an example crossbar memory cell array with various types of cells according to disclosed aspects.

Turning now to FIG. 7, illustrated is a system 700 comprising an architecture of a crossbar array of two-terminal memory cells in accordance with various embodiments described. System 700 is used to illustrate practical distinctions between memory cells that are configured to retain memory and prevent structural deformation without a sufficient rupture occurring for the cell to prematurely enter into an Off-state over time. The system 700 comprises various memory cells having different structures as described herein, such as memory cells that have no additional conducting layer and memory cells having one or more conducting layers within the cell. The cells are configured to retain and prevent memory loss via filament rupture by controlling the switching medium thickness of the cells based on a filament width and a number of conducting layers of the cell.

The cells of the system 700 can operate to control memory retention over the life of the array and be configured according to one or more different cells that are independently configured differently for controlling their respective filaments against rupture and loss of the retained resistance or data. The system 700 includes various wordlines 702 and bitlines 704 in which a single cell among the array can be selected based upon an applied bias between a particular wordline 702 and a particular bitline 704 with the selected cell representing the junction.

The array of solid state memory cells is configured to store digital information. The cells can respectively have the same and/or different lateral device widths (e.g., D of cell 912). As discussed above, each memory cell can include a pair of electrodes respectively configured to conduct electricity at a first electrical resistance, an insulating switching medium configured to conduct electricity at a second electrical resistance that is greater than the first electrical resistance, and a semi-stable conductive filament within at least a portion of the insulating switching medium. The insulator switching medium of the respective cells (e.g., cell 912, non-selected cell 908, selected cell 906, and/or any other cell) can comprises a thickness that is a predetermined function of the filament width in order to stabilize the semi-stable conductive filament of the respective cell from a rupture or a retention failure.

The cells of the array (e.g., 906, 908, and/or 912) can respectively have no conducting layers, one conducting layer, and/or two conducting layers throughout. For cell(s) having no conducting layers the thickness of the switching medium is controlled according to the predetermined function, in which the thickness is less than a multiple of the filament width formed and/or the device width D, for example. In the case of a cell having no additional layers, the multiple comprises at least one of about 2.2, if the lateral device size is substantially equivalent to the filament width, about 1.1, if the filament width is about a half of the lateral device width, and/or the multiple is about 0.5, if the filament width is about a quarter of the lateral device width. The array can comprise one or more memory cells based on these multiples for the predetermined function utilized to configure the thickness of the switching medium to control memory retention.

One or more cells of the array can also comprise a first conductive layer disposed between an electrode of the pair of electrodes and the insulating switching medium within the cells. The multiple of the predetermined function for configuring the switching medium thickness to prevent filament rupture and memory loss can comprise at least one of about 1.4, in which the lateral device width D is substantially equivalent to the filament width. In one or more cells having one conducting layer, the multiple can be about 0.7, in which the filament width is about a half of the lateral device width, and/or the multiple can be about 0.35, if the filament width comprises about a quarter of the lateral device width D, for example.

One or more cells (e.g., 906, 908, and/or one or more of cells 912) of the array can also comprise more than one conductive layer disposed between the switching layer and the first or second electrode therein. The cells can be configured to control filament structural evolution by preventing a complete breakdown and rupture of the filament (e.g., within one or more regions) of the conductive paths by having a thickness that is controlled based on a predetermined function, which can be different from the predetermined functions for cells of the array having one or no conducting layers therein. For example, the thickness can be less than a multiple of the device width D, or the filament width (e.g., W, W1, W2), as discussed above. The multiple can comprise at least one of about 1.2 when the lateral device size is substantially equivalent to the filament width, about 0.6 when the filament width is about a half of the lateral device width, and/or the multiple is about 0.3 if the filament width is about a quarter of the lateral device width. The disclosure is not limited to any one particular configuration of cells within an array, nor to any number of arrays configured in any one particular configuration. For example, multiple arrays can be configured with cells having zero or more conducting layers, in which the switching medium is configured to remain as programmed until erased or at any other point in time based on a predetermined function of the filament length and/or switching medium thickness according to a relationship to the filament width and/or filament radius with respect to time.

The aforementioned diagrams have been described with respect to interaction between several components of a memory cell, or memory architectures comprised of such memory cells. It should be appreciated that in some suitable alternative aspects of the subject disclosure, such diagrams can include those components and architectures specified therein, some of the specified components/architectures, and/or additional components/architectures. Sub-components can also be implemented as electrically connected to other sub-components rather than included within a parent architecture. Additionally, it is noted that one or more disclosed processes can be combined into a single process providing aggregate functionality. For instance, a program process can comprise a read process, or vice versa, to facilitate programming and reading a semiconductor cell by way of a single process. In addition, it should be appreciated that respective rows of disclosed memory architectures can be erased in groups (e.g., multiple rows erased concurrently) or individually. Moreover, it should be appreciated that multiple memory cells on a particular row can be programmed in groups (e.g., multiple memory cells programmed concurrently) or individually. Components of the disclosed architectures can also interact with one or more other components not specifically described herein but known by those of skill in the art.

Figure 10:
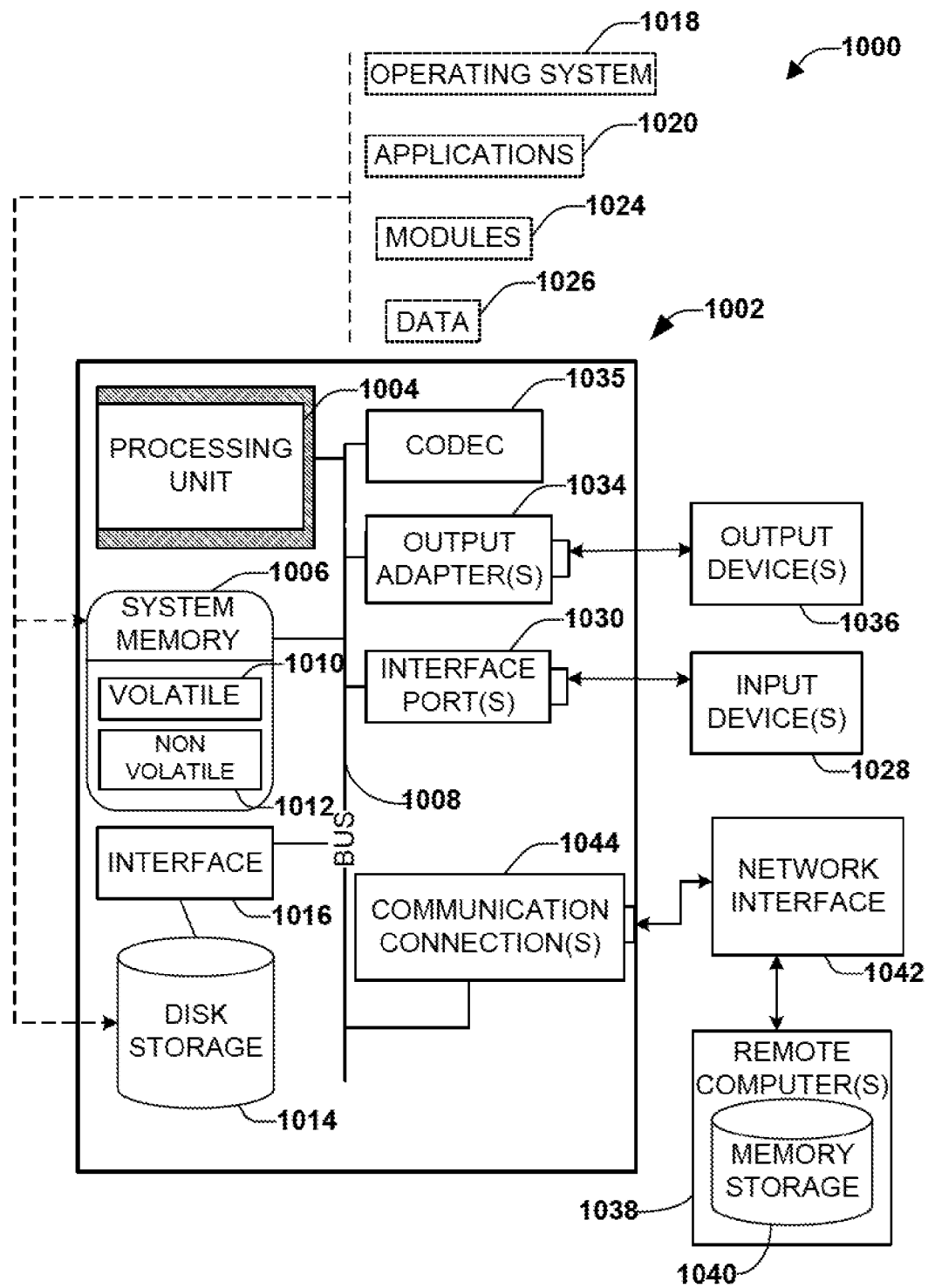
FIG. 10 illustrates a block diagram of an example operating environment for facilitating implementation of one or more aspects disclosed herein.

In view of the exemplary diagrams described supra, process methods that can be implemented in accordance with the disclosed subject matter will be better appreciated with reference to the flow chart of FIG. 10. While for purposes of simplicity of explanation, the method of FIG. 10 is shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 8:
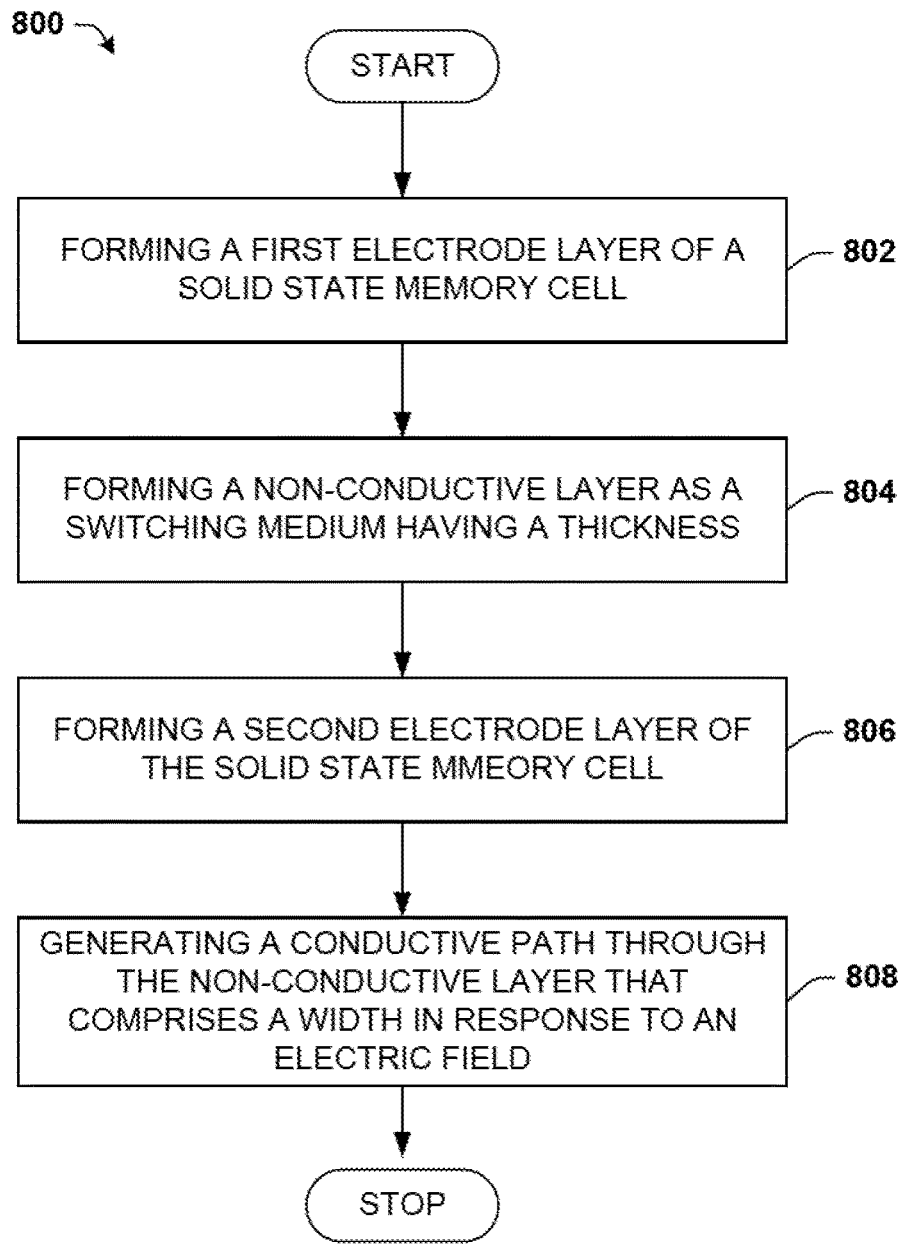
FIG. 8 illustrates a flowchart of a sample method for fabricating a rectified resistive switching solid state memory cell according to particular aspects.

FIG. 8 illustrates a flowchart of an example method 1000 for fabricating a memory cell that retains memory throughout a structural evolution process from a state of initial programming in accordance with various aspects described herein. The method initiates at start, and at 802, a first electrode layer of a solid state memory cell is formed. For example, a metal layer can be disposed for the generation of a resistive-switching memory cell devices or units, which can include, for example, a filamentary-based memory cell having a p-type or n-type silicon bearing layer (e.g., p-type or n-type polysilicon, p-type or n-type SiGe), an undoped silicon bearing layer (e.g., having intrinsic characteristics), and an active metal layer for providing filament forming ions to the amorphous silicon layer (e.g., silver (Ag), gold (Au), titanium (Ti), nickel (Ni), aluminum (Al), chromium (Cr), iron (Fe), manganese (Mn), tungsten (W), vanadium (V), cobalt (Co), platinum (Pt), and/or palladium (Pd)).

At 804, a non-conductive layer is formulated as a switching medium that has a thickness based on a predetermined function with respect to time. A variable or factor of the predetermined function can comprise a spherical radius at a different point in time than an initial programmed On-state, and/or a width of the filament or semi-stable region of a conductive pathway through the switching medium, and also be dependent upon a multiple of the width or spherical radius. In one embodiment, the non-conductive layer has the thickness that is controlled based on a width or diameter of the filament that is formed within the switching medium. The switching medium can comprise at least one of amorphous silicon, amorphous silicon germanium, $TiO_x$, $TaO_x$, $HfO_x$, $NiO_x$, $WO_x$, $AlO_x$, $CuO_x$, $SiO_x$, $GeO_x$, $Si_xGe_yO_z$, $SiO_xN_y$, $Ag_xGe_ySe_z$, $Ag_2Se$, $Cu_2S$, an oxide and/or a chalcogenide that is at least in part porous with respect to ion particles that form a filament (e.g., conductive path 108).

At 806, a second electrode layer of the solid state memory is formed, and at 808, the conductive path through the non-conducting layer that comprises a width is generated in response to an electric field. The conductive path, for example, can be comprised of metal ion particles from in the switching medium, from the top or bottom electrode or from metal in the switching medium and from the top or bottom electrode depending upon whether the memory cell is a metal oxide based RRAM, an oxide based RRAM, a solid electrolyte based RRAM, or an amorphous silicon based RRAM, for example.

The method can further comprise disposing one or more conducting layers between the switching medium and the bottom electrode, the top electrode, or both the bottom electrode and the top electrode. In one embodiment, the thickness of the switching medium is less than a multiple times the lateral device width. The multiple factor can change when the filament width is a fraction of the lateral device width and when one or more conducting layers are disposed. The multiple can be changed for memory cell switching medium thickness based on a number of the one or more conducting layers being disposed, for example.

Figure 9:
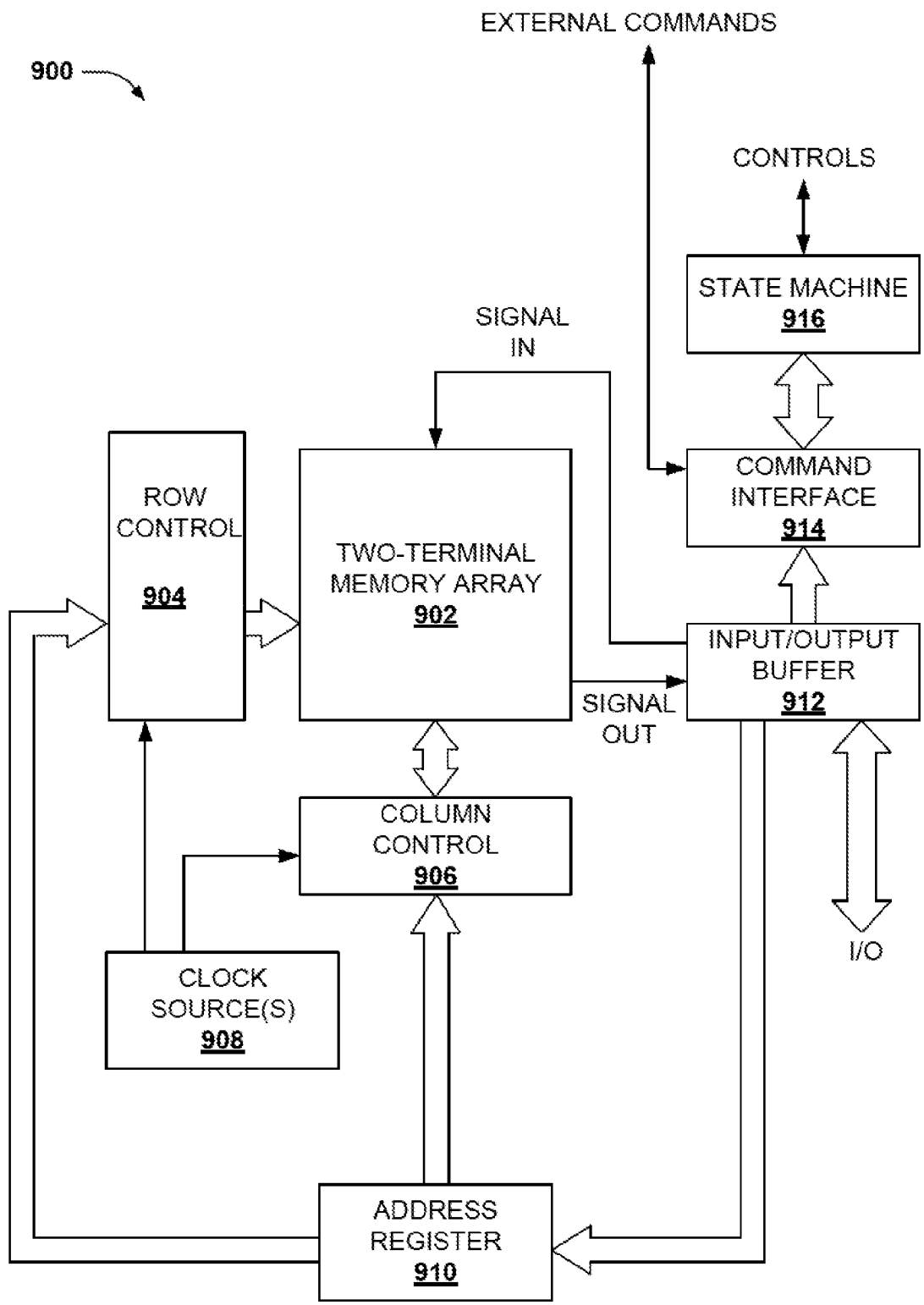
FIG. 9 depicts a block diagram of an example electronic control environment for an array of memory cells according to further disclosed aspects.

FIG. 9 illustrates a block diagram of an example operating and control environment 900 for a memory array 902 according to aspects of the subject disclosure. In at least one aspect of the subject disclosure, memory array 902 can comprise a variety of memory cell technology. Particularly, memory array 902 can be configured or operated to mitigate or avoid sneak path currents of the memory array 902, as described herein.

A column controller 906 can be formed adjacent to memory array 902. Moreover, column controller 906 can be electrically coupled with bit lines of memory array 902. Column controller 906 can control respective bitlines, applying suitable program, erase or read voltages to selected bitlines.

In addition, operating and control environment 900 can comprise a row controller 904. Row controller 904 can be formed adjacent to column controller 906, and electrically connected with word lines of memory array 902. Row controller 904 can select particular rows of memory cells with a suitable selection voltage. Moreover, row controller 904 can facilitate program, erase or read operations by applying suitable voltages at selected word lines.

A clock source(s) 908 can provide respective clock pulses to facilitate timing for read, write, and program operations of row control 904 and column control 906. Clock source(s) 908 can further facilitate selection of word lines or bit lines in response to external or internal commands received by operating and control environment 900. An input/output buffer 912 can be connected to an external host apparatus, such as a computer or other processing device (not depicted) by way of an I/O buffer or other I/O communication interface. Input/output buffer 912 can be configured to receive write data, receive an erase instruction, output readout data, and receive address data and command data, as well as address data for respective instructions. Address data can be transferred to row controller 904 and column controller 906 by an address register 910. In addition, input data is transmitted to memory array 902 via signal input lines, and output data is received from memory array 902 via signal output lines. Input data can be received from the host apparatus, and output data can be delivered to the host apparatus via the I/O buffer.

Commands received from the host apparatus can be provided to a command interface 914. Command interface 914 can be configured to receive external control signals from the host apparatus, and determine whether data input to the input/output buffer 912 is write data, a command, or an address. Input commands can be transferred to a state machine 916.

State machine 916 can be configured to manage programming and reprogramming of memory array 902. State machine 916 receives commands from the host apparatus via input/output interface 912 and command interface 914, and manages read, write, erase, data input, data output, and like functionality associated with memory array 902. In some aspects, state machine 916 can send and receive acknowledgments and negative acknowledgments regarding successful receipt or execution of various commands.

To implement read, write, erase, input, output, etc., functionality, state machine 916 can control clock source(s) 908. Control of clock source(s) 908 can cause output pulses configured to facilitate row controller 904 and column controller 906 implementing the particular functionality. Output pulses can be transferred to selected bit lines by column controller 906, for instance, or word lines by row controller 904, for instance.

In connection with FIG. 10, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

With reference to FIG. 10, a suitable environment 1000 for implementing various aspects of the claimed subject matter includes a computer 1002. The computer 1002 includes a processing unit 1004, a system memory 1006, a codec 1035, and a system bus 1008. The system bus 1008 couples system components including, but not limited to, the system memory 1006 to the processing unit 1004. The processing unit 1004 can be any of various available processors. Dual microprocessors and other multiprocessor architectures also can be employed as the processing unit 1004.

The system bus 1008 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1006 includes volatile memory 1010 and non-volatile memory 1012. The basic input/output system (BIOS), containing the basic routines to transfer information between elements within the computer 1002, such as during start-up, is stored in non-volatile memory 1012. In addition, according to present innovations, codec 1035 may include at least one of an encoder or decoder, wherein the at least one of an encoder or decoder may consist of hardware, software, or a combination of hardware and software. Although, codec 1035 is depicted as a separate component, codec 1035 may be contained within non-volatile memory 1012. By way of illustration, and not limitation, non-volatile memory 1012 can include read only memory (ROM), programmable ROM (PROM), electrically programmable ROM (EPROM), electrically erasable programmable ROM (EEPROM), or flash memory. Volatile memory 1010 includes random access memory (RAM), which acts as external cache memory. According to present aspects, the volatile memory may store the write operation retry logic (not shown in FIG. 10) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM.

Computer 1002 may also include removable/non-removable, volatile/non-volatile computer storage medium. FIG. 10 illustrates, for example, disk storage 1014. Disk storage 1014 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1014 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1014 to the system bus 1008, a removable or non-removable interface is typically used, such as interface 1016. It is appreciated that storage devices 1014 can store information related to a user. Such information might be stored at or provided to a server or to an application running on a user device. In one embodiment, the user can be notified (e.g., by way of output device(s) 1036) of the types of information that are stored to disk storage 1014 and/or transmitted to the server or application. The user can be provided the opportunity to opt-in or opt-out of having such information collected and/or shared with the server or application (e.g., by way of input from input device(s) 1028).

It is to be appreciated that FIG. 10 describes software that acts as an intermediary between users and the basic computer resources described in the suitable operating environment 1000. Such software includes an operating system 1018. Operating system 1018, which can be stored on disk storage 1014, acts to control and allocate resources of the computer system 1002. Applications 1020 take advantage of the management of resources by operating system 1018 through program modules 1024, and program data 1026, such as the boot/shutdown transaction table and the like, stored either in system memory 1006 or on disk storage 1014. It is to be appreciated that the claimed subject matter can be implemented with various operating systems or combinations of operating systems.

A user enters commands or information into the computer 1002 through input device(s) 1028. Input devices 1028 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1004 through the system bus 1008 via interface port(s) 1030. Interface port(s) 1030 include, for example, a serial port, a parallel port, a game port, and a universal serial bus (USB). Output device(s) 1036 use some of the same type of ports as input device(s) 1028. Thus, for example, a USB port may be used to provide input to computer 1002 and to output information from computer 1002 to an output device 1036. Output adapter 1034 is provided to illustrate that there are some output devices 1036 like monitors, speakers, and printers, among other output devices 1036, which require special adapters. The output adapters 1034 include, by way of illustration and not limitation, video and sound cards that provide a means of connection between the output device 1036 and the system bus 1008. It should be noted that other devices and/or systems of devices provide both input and output capabilities such as remote computer(s) 1038.

Computer 1002 can operate in a networked environment using logical connections to one or more remote computers, such as remote computer(s) 1038. The remote computer(s) 1038 can be a personal computer, a server, a router, a network PC, a workstation, a microprocessor based appliance, a peer device, a smart phone, a tablet, or other network node, and typically includes many of the elements described relative to computer 1002. For purposes of brevity, only a memory storage device 1040 is illustrated with remote computer(s) 1038. Remote computer(s) 1038 is logically connected to computer 1002 through a network interface 1042 and then connected via communication connection(s) 1044. Network interface 1042 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1044 refers to the hardware/software employed to connect the network interface 1042 to the bus 1008. While communication connection 1044 is shown for illustrative clarity inside computer 1002, it can also be external to computer 1002. The hardware/software necessary for connection to the network interface 1042 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method of fabricating a solid state memory cell, comprising:
    forming a bottom electrode layer;
    forming a non-conductive layer as a switching medium above the bottom electrode, the switching medium having a thickness; and
    forming a top electrode layer opposite to the bottom electrode and above the switching medium, wherein forming the non-conductive layer further comprises selecting the thickness of the switching medium from a function of surface energy of particles of the top electrode layer, the function comprising a relation between a stable structure and an unstable structure of the particles of the top electrode layer within the non-conductive layer.

2. The method of claim 1, further comprising generating a conductive path through the non-conductive layer, at least a portion of the conductive path comprising a filament width, wherein the solid state memory cell comprises a lateral device width of the solid state memory cell that is approximately equal to the filament width.

3. The method of claim 1, further comprising generating a conductive path through the non-conductive layer, at least a portion of the conductive path comprising a filament width, wherein the solid state memory cell comprises a lateral device width of the solid state memory cell that is different than the filament width.

4. The method of claim 3, wherein the filament width is less than about 10 nm.

5. The method of claim 1, further comprising:
    disposing one or more additional layers between the switching medium and the bottom electrode layer, the top electrode layer, or both the bottom electrode layer and the top electrode layer.

6. The method of claim 5, wherein the relation between the stable structure and the unstable structure includes an approximate area of one end surface of the stable structure in response to disposing one additional layer between the switching medium and the bottom electrode or the top electrode, and includes an approximate area of two end surfaces of the stable structure in response to disposing two additional layers respectively between the switching medium and the bottom electrode and between the switching medium and the top electrode.

7. The method of claim 5, wherein the one or more additional layers independently comprise at least one of a tunneling insulating layer that controls a conductance of the solid state memory cell in an on-state, a semi-conductor layer that controls the conductance of the solid state memory cell in the on-state, or an oxygen vacancy metal oxide that provides an oxygen vacancy to the switching medium.

8. The method of claim 1, wherein the particles of the top electrode layer comprise filament forming ions selected from a group consisting of:
    silver (Ag), titanium (Ti), aluminum (Al), tungsten (W), copper (Cu), platinum (Pt), palladium (Pd).

9. The method of claim 1, wherein forming the top electrode layer further comprises forming the top electrode layer with a metal nitride configured to provide the particles of the top electrode layer.

10. The method of claim 9, wherein the particles of the top electrode layer comprise particles of the metal nitride.

11. The method of claim 1, wherein forming the non-conductive layer as the switching medium further comprises forming the non-conductive layer from a material that is at least in part porous with respect to the particles of the top electrode layer, the material being comprising $SiO_xN_y$.

12. The method of claim 1, further comprising applying an electric signal to the solid state memory cell and generating a conductive path through the non-conductive layer, at least a portion of the conductive path comprising a filament width.

13. The method of claim 12, wherein forming the non-conductive layer further comprises forming the non-conductive layer having the thickness equal to or less than about two and one quarter times the filament width.

14. The method of claim 12, wherein forming the non-conductive layer further comprises forming the non-conductive layer having the thickness to be approximately equal in value to the filament width.

15. The method of claim 12, further comprising forming a semi-conductive layer between the non-conductive layer and the bottom electrode layer.

16. The method of claim 15, wherein forming the non-conductive layer further comprises forming the non-conductive layer having the thickness T related to the filament width W, as follows:

$$T \sim 2.71*(\tfrac{1}{2}W).$$

17. The method of claim 1, wherein the thickness of the switching medium facilitates formation of a stable conductive path past a structural evolution of the conductive path; the method further comprising:
    forming the solid state memory cell having a lateral device width;
    generating a conductive filament with a stable region having a relatively high density of ions; and
    generating a semi-stable region for the conductive filament characterized by a filament width and having a low density of ions relative to the stable region of the conductive filament that retains an on-state as initially programmed.

18. The method of claim 17, further comprising forming the thickness of the non-conductive layer to be about 2.2 times the lateral device width, and the lateral device width is substantially equal to the filament width.

19. The method of claim 17, further comprising forming the thickness of the non-conductive layer to be about 1.1 times the lateral device width, and the lateral device width is about 2 times the filament width.

20. The method of claim 17, further comprising forming the thickness of the non-conductive layer to be about 0.5 times the lateral device width, and the lateral device width is about 4 times the filament width.

21. The method of claim 1, wherein forming the non-conductive layer further comprises forming the non-conductive layer comprising silicon and nitrogen.

22. A method of fabricating a memory cell array, comprising:
    forming a plurality of bit lines extending in a first direction;

forming a plurality of non-conductive structures as a switching medium comprising overlying the plurality of bit lines, the switching medium having a thickness; and forming a plurality of word lines extending in a second direction, wherein the plurality of word lines cross the plurality of bit lines forming a plurality of intersections, wherein the plurality of non-conductive structures are located at respective ones of the plurality of intersections, and wherein the thickness of the switching medium is selected from a function of surface energy of particles of the plurality of word lines or of the plurality of bit lines.

23. The method of claim 22, wherein the plurality of non-conductive structures comprises a lateral device width that is approximately equal to a width of a conductive path formed of the particles of the plurality of word lines or of the plurality of bit lines within one of the plurality of non-conductive structures.

24. The method of claim 22, wherein forming the plurality of non-conductive structures further comprises forming a layer of silicon and nitrogen material that is at least in part porous with respect to the particles of the plurality of word lines or the plurality of bit lines.

25. The method of claim 22, wherein forming the plurality of non-conductive structures comprises forming a layer of $SiO_xN_y$ material that is at least in part porous with respect to the particles of the plurality of word lines or the plurality of bit lines.

26. The method of claim 22, wherein the particles of the plurality of word lines or of the plurality of bit lines are selected from a group consisting of: Ag, Ti, Al, W, Cu, Pt and Pd.

* * * * *